United States Patent
Dionis

(10) Patent No.: US 11,593,284 B2
(45) Date of Patent: Feb. 28, 2023

(54) METHOD FOR MANAGING AN OPERATION FOR MODIFYING THE STORED CONTENT OF A MEMORY DEVICE, AND CORRESPONDING MEMORY DEVICE

(71) Applicant: STMicroelectronics (Rousset) SAS, Rousset (FR)

(72) Inventor: Gilles Dionis, Peynier (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/450,238

(22) Filed: Oct. 7, 2021

(65) Prior Publication Data
US 2022/0147469 A1    May 12, 2022

(30) Foreign Application Priority Data
Nov. 12, 2020    (FR) ...................................... 2011586

(51) Int. Cl.
| | | |
|---|---|---|
| *G06F 3/06* | (2006.01) | |
| *G06F 13/16* | (2006.01) | |
| *G06F 13/42* | (2006.01) | |

(52) U.S. Cl.
CPC ........ *G06F 13/1668* (2013.01); *G06F 3/0604* (2013.01); *G06F 3/0659* (2013.01); *G06F 3/0673* (2013.01); *G06F 13/4291* (2013.01); *G06F 2213/0016* (2013.01)

(58) Field of Classification Search
None
See application file for complete search history.

(56) References Cited

U.S. PATENT DOCUMENTS

| | | | |
|---|---|---|---|
| 10,860,417 B1 * | 12/2020 | Spirkl ...................... G11C 7/10 |
| 2003/0065856 A1 * | 4/2003 | Kagan ................... G06F 13/387 |
| | | | 710/263 |
| 2008/0225603 A1 | 9/2008 | Hein | |
| 2018/0301196 A1 | 10/2018 | Tailliet et al. | |
| 2020/0202924 A1 | 6/2020 | Intrater et al. | |
| 2020/0242069 A1 * | 7/2020 | Lin ..................... G06F 13/4282 |
| 2022/0206695 A1 * | 6/2022 | Zhao .................... G06F 3/0673 |

* cited by examiner

*Primary Examiner* — Idriss N Alrobaye
*Assistant Examiner* — Dayton Lewis-Taylor
(74) *Attorney, Agent, or Firm* — Slater Matsil, LLP

(57) ABSTRACT

An embodiment method for managing an operation for modifying the content of the memory plane of a memory device coupled to a processing unit, comprises a communication by the processing unit to the memory device of a control of the operation, an execution of the operation by the memory device, and at the end of the operation, a communication by the memory device itself to the processing unit of information indicating the end of the operation.

20 Claims, 6 Drawing Sheets

METHOD FOR MANAGING AN OPERATION FOR MODIFYING THE STORED CONTENT OF A MEMORY DEVICE, AND CORRESPONDING MEMORY DEVICE

CROSS-REFERENCE TO RELATED APPLICATIONS

This application claims the benefit of French Application No. 2011586, filed on Nov. 12, 2020, which application is hereby incorporated herein by reference.

TECHNICAL FIELD

Embodiments relate to microelectronics, in particular memory devices and more particularly the management of the modification of the content of their memory plane, for example during a write operation.

BACKGROUND

Embodiments apply to all types of memories, in particular, but in a non-limiting manner, non-volatile memories of the electrically erasable and programmable type (EEPROM memories) or else flash memories.

A modification of the content of the memory plane generally encompasses a write operation in this memory plane, but also depending on the vocabulary used for different types of memories, a write cycle (erasure step followed by a programming step) of an EEPROM memory, or else a programming (write-erase cycle) of a flash memory.

Currently, when a memory device is used in an application wherein it is connected to a processing unit, for example a microprocessor or microcontroller, the only way to know if the memory is available again after controlling an operation for modifying the content of its memory plane (writing, erasing or programming) is to use the resources of the microprocessor to check the state of the memory.

More specifically, according to a first solution, the microprocessor can internally trigger a time counter when the write control is emitted. The value of this counter depends on the features of the memory. When the counter has reached its maximum count value, the write operation is then deemed to be completed.

According to a second solution, the microprocessor can perform an operation called "polling" operation according to a name well known to the person skilled in the art, consisting in interrogating the memory to find out the logic state of some control bits so as to determine when the write operation ended and therefore when the memory is available again.

However, regardless of the solution considered, it requires for the microprocessor the use of internal resources which cannot then be available to perform other actions. Furthermore, using these internal resources can slow down the application and increase current consumption.

Furthermore, as regards the first solution mentioned above, the maximum count value is generally taken by default to be greater than the time required to perform the write operation.

SUMMARY

There is consequently a need to overcome the disadvantages mentioned above and to propose a solution allowing a processing unit, for example a microprocessor, to determine the end time of an operation for modifying the content of the memory plane of a memory device without impacting too much its operation in particular in terms of consumption.

It is also proposed to provide a solution which does not impact the volume requirement of the microprocessor and of the memory device.

According to one implementation and embodiment, it is proposed that the memory device itself inform the processing unit of the end of an operation for modifying its memory content, for example a write operation, in particular using an already existing memory device pin.

According to one aspect, provision is thus made of a method for managing an operation for modifying (for example writing, erasing, programming) the content of the memory plane of a memory device coupled to a processing unit.

The method according to this aspect comprises a communication by the processing unit to the memory device, of a control of the operation, an execution of the operation by the memory device, and at the end of the operation, a communication by the memory device itself to the processing unit of information indicating the end of the operation.

Thus, the processing unit, for example the microprocessor, does not use its internal resources to determine the end of the modification operation since it is the memory device itself which will inform the processing unit of the end of this operation.

Thus, this does not slow down the application and the current consumption is not impacted.

In practice, the memory device may include an auxiliary pin whose logic state is managed by the processing unit and can be interpreted by the memory device only during the communication of the control by the processing unit.

In this case, the method advantageously comprises, during the execution of the operation and during the communication of the stop information, a management of the logic state of the auxiliary pin by the memory device and a configuration of the processing unit in interruption detection mode on the auxiliary pin.

The communication of the stop information then comprises a modification by the memory device of the logic state of the auxiliary pin which can be interpreted by the processing unit as an interruption.

Thus, during communication between the processing unit and the memory device for emitting the control of the operation, this auxiliary pin is in an input mode and its logic state is managed by the processing unit. This logic state can be interpreted by the memory device.

On the other hand, from the end of the stored content modification operation control (which marks the actual start of the modification operation), the logic state of this auxiliary pin can no longer be interpreted by the memory device. Consequently, this auxiliary pin will switch into an output mode and be used to indicate to the processing unit that the write operation has been completed.

More specifically, it is therefore the memory device which will itself manage the logic state of this auxiliary pin and modify its logic state (create a falling edge for example) once the write operation (for example) is completed. The processing unit, then configured in interruption mode, will detect this interruption and conclude that the write operation is complete and that the memory is available again.

It can therefore be seen here that no internal microprocessor resources have been used, as indicated above. The microprocessor simply has to manage an interruption on the line connecting the auxiliary pin to the processing unit.

And, since using an already existing memory device pin, there is no additional volume requirement for the proposed solution.

According to one implementation, the memory device is coupled to the processing unit by a communication medium supporting a serial communication protocol.

This serial communication protocol includes a clock signal line and at least one data signal line as well as an auxiliary line connecting the processing unit to the auxiliary pin.

And, this auxiliary line is separate from the clock signal line and from the at least one data line.

Indeed, the clock signal line and the data line(s) should not be used as an auxiliary line because a transition on these lines could be interpreted as another event by the other processing unit and/or another memory device connected to the communication medium.

The communication medium can support, for example, the I2C communication protocol.

In this case, one can select as an auxiliary pin the one which receives, during the communication of the control by the processing unit, an auxiliary logic signal prohibiting or authorizing the execution of the operation.

This auxiliary pin can thus be the pin commonly referred to by the person skilled in the art by the acronym /WC receiving the logic signal of the same name.

The communication medium can also be a medium supporting the SPI communication protocol.

In this case, the auxiliary pin may be the one which receives, during the communication of the control by the processing unit, an auxiliary logic signal causing or not a pause in the communication between the processing unit and the memory device.

In other words, this auxiliary pin can be, for example, the one usually known by the person skilled in the art under the name "HOLD" receiving the logic signal of the same name.

Alternatively, still when the communication protocol is the SPI protocol, the auxiliary pin can be the one which receives, during the communication of the control by the processing unit, an auxiliary logic signal activating or deactivating a protection of the memory device from the operation.

In other words, in this case, this auxiliary pin may be the one usually known to the person skilled in the art by the acronym WP receiving the logic signal of the same name.

The memory device can be a non-volatile memory device, for example an EEPROM memory or a flash memory.

According to another aspect, provision is made of a memory device comprising a memory plane, a control interface configured to be coupled to a processing unit and intended to receive from the processing unit a control of an operation for modifying the content of the memory plane.

The memory device also comprises an auxiliary interface configured to be coupled to the processing unit.

The memory device further comprises processing circuit configured to execute the operation and communicate information indicating the end of the operation to the processing unit via the auxiliary interface, at the end of the operation.

According to one embodiment, the auxiliary interface includes an auxiliary pin whose logic state is intended to be managed by the processing unit and which can be interpreted by the processing circuit only during the communication of the control by the processing unit.

Moreover, the processing circuit is configured, during the execution of the operation and during the communication of the stop information, to manage the logic state of the auxiliary pin and modify the logic state of the auxiliary pin so as to generate an interruption which can be interpreted by the processing unit as the stop information.

According to one embodiment, the control interface and the auxiliary interface are configured to be coupled to the processing unit by a communication medium configured to support a serial communication protocol and including a clock signal line, at least one data signal line and one auxiliary line connecting the processing unit to the auxiliary pin.

This auxiliary line is separate from the clock signal line and from the at least one data line.

When the communication medium is configured to support the I2C communication protocol, the auxiliary pin may be the one configured to receive, during the communication of the control by the processing unit, an auxiliary logic signal prohibiting or authorizing the execution of the operation.

When the communication medium is configured to support the SPI communication protocol, the auxiliary pin can be the one configured to receive, during the communication of the control by the processing unit, an auxiliary logic signal causing or not a pause in the communication between the processing unit and the memory device.

Alternatively, still in the case of an SPI communication protocol, the auxiliary pin can be the one configured to receive, during the communication of the control by the processing unit, an auxiliary logic signal activating or deactivating a protection of the memory device from the operation.

According to another aspect, provision is made of a system comprising a processing unit, for example a microprocessor or a microcontroller, the memory device as defined above, and a communication medium coupling the control interface and the auxiliary interface of the device to the processing unit.

BRIEF DESCRIPTION OF THE DRAWINGS

Other advantages and features of the invention will become apparent upon reading the detailed description below and upon studying the appended drawings which are not limiting, wherein.

DETAILED DESCRIPTION OF ILLUSTRATIVE EMBODIMENTS

Figure 1:
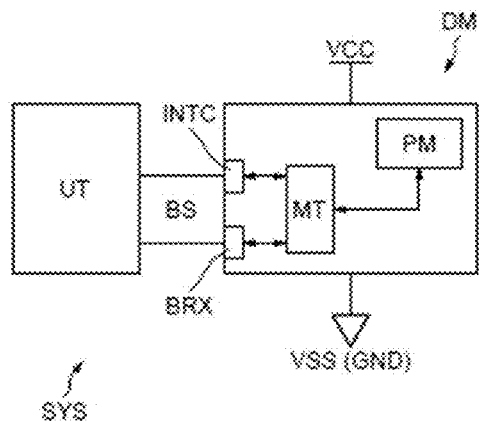
FIG. 1 illustrates a processing unit connected to a memory device by means of a communication medium.

In FIG. 1, the reference SYS denotes a system including a processing unit UT, for example a microprocessor or a microcontroller, connected to a memory device DM by means of a communication medium BS, for example a bus.

The memory device DM is here a non-volatile memory, for example an EEPROM memory or a flash memory, without these examples being limiting.

The memory device includes a memory plane PM for storing data as well as a control interface INTC and an auxiliary interface BRX.

As will be seen in more detail below, the control interface, connected to the bus BS, is intended to receive from the processing unit UT a control of an operation for modifying the content of the memory plane, for example a write operation.

Processing circuit MT is connected between the control interface INTC, the auxiliary interface BRX and the memory plane PM and includes conventional circuitry configured to perform the operation as well as other circuitry, a structure example of which will be described in more detail below, intended to communicate information indicating the end of this operation to the processing unit UT via the auxiliary interface BRX, at the end of the operation (here the write operation).

Finally, the memory device includes one pin connected to a power supply voltage VCC and another pin connected to a reference voltage VSS, for example ground GND.

It will be seen in more detail below that the auxiliary interface BRX can be a pin of the memory device usually not used when the memory device is no longer selected by the processing unit.

Figure 2:
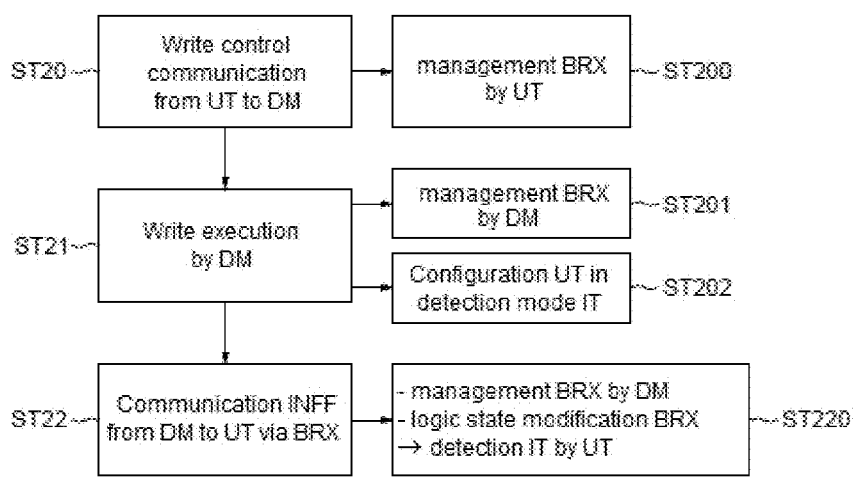
FIG. 2 illustrates a method for managing the operation for modifying the content of the memory plane of the memory device.

Reference is now made more particularly to FIG. 2 to describe an embodiment of a method for managing the operation for modifying the content of the memory plane PM of the memory device DM.

In general, in a step ST20, the processing unit communicates the control of the modification operation, here the write control, to the memory device DM.

In this communication phase, the auxiliary interface BRX is managed by the processing unit UT (step ST200).

This auxiliary interface BRX is then in an input mode.

Once the write control has been received and the memory device has been deselected on the bus BS, the memory device DM executes in step ST21 the operation, in this case writing a given datum to a defined address.

While in step ST200, the logic state of the auxiliary interface BRX is managed by the processing unit UT and can be interpreted by the memory device, during the execution ST21 of the write, the logic state of the auxiliary interface BRX is managed this time by the memory device (step ST201) and the processing unit UT is configured in interruption detection mode IT on the auxiliary interface BRX (step ST202).

This auxiliary interface BRX is then in an output mode.

At the end of the write operation, the memory device DM communicates (step ST22) information INFF indicating the end of the write operation to the processing unit via the auxiliary interface BRX.

In this phase of communication ST22, the management of the logic state of the auxiliary pin is always carried out by the memory device (step ST220) and the communication of the stop information INFF comprises a modification by the memory device DM of the logic state of the auxiliary interface BRX, which can be interpreted by the processing unit UT as an interruption IT. The detection of this interruption IT by the processing unit indicates to the latter that the write operation is complete.

Two particular exemplary embodiments and implementations which can be used respectively when the bus BS is a bus supporting the $I^2C$ protocol and the SPI protocol will now be described in more detail.

Figure 3:
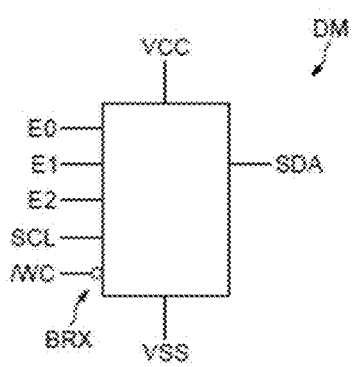
FIG. 3 illustrates an integrated non-volatile EEPROM memory device able to communicate on an $I^2C$ bus.

FIG. 3 shows an integrated non-volatile memory device of the EEPROM type, able to communicate on the bus BS of the $I^2C$ type.

In this example, the memory device includes 3 hardware identification pins E0, E1, E2, without this number being limiting.

The hardware identification pins E0, E1, E2 are intended to be assigned a respective potential defining an assignment code dedicated to the memory device DM. The assignment of these potentials is carried out in a material way during the integration of the integrated circuit on a card, for example.

These hardware identification pins E0, E1, E2 are coupled to VCC or VSS. When not connected, these inputs are typically read by default at VSS. A coupling to VCC defines a logic signal of value "1" in the assignment code, and a coupling to VSS defines a logic signal of value "0".

The memory plane of the memory device DM allows digital data to be stored in memory locations arranged in rows and columns. A memory location generally includes a floating gate transistor capable of physically storing a representation of a digital datum (that is to say a bit), in a conventional manner known per se. Each bit is stored in a memory location and is assigned a respective memory address, the communication of this address allowing memory to access that memory location in read or write mode.

The integrated memory device DM also includes an input/output pin of a serial data line SDA and an input pin of a serial clock line SCL, as well as an auxiliary pin BRX for receiving a write control signal /WC.

The input/output pin of the serial data line SDA and the input pin of the serial clock line SCL are part of the control interface INTC and the auxiliary pin BRX forms the auxiliary interface.

The input/output pin SDA is used to transfer incoming or outgoing data.

The signal applied to the input pin SCL is used to clock the incoming and outgoing signals on the line SDA.

The present signal /WC on the auxiliary pin BRX allows to protect the content of the memory from accidental write operations.

For example, the write operations are made impossible in the memory when the signal /WC present on the pin BRX is at a high level. Write operations are possible when the /WC signal present on the pin BRX is low or left floating.

The $I^2C$ bus is a well-known serial inter-integrated circuit communication standard.

Figure 4:
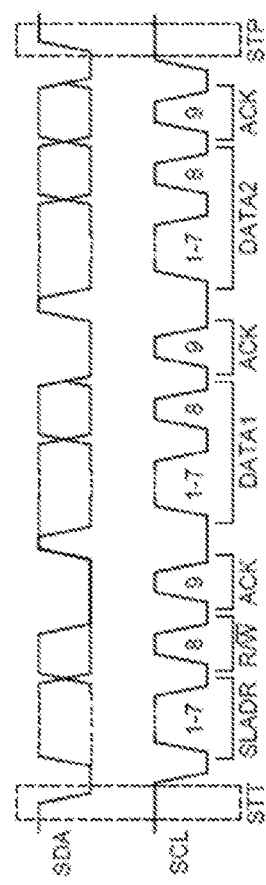
FIG. 4 illustrates the signals of an example communication carried out on an $I^2C$ bus.

FIG. 4 shows the signals of an example of communication carried out on an $I^2C$ bus.

The $I^2C$ bus includes two wires, a serial data line SDA and a serial clock line SCL, which transmit information between apparatuses connected to the $I^2C$ bus. Each apparatus is recognized by a unique slave address (whether it is for example a microcontroller, a memory or a keyboard interface) and can operate as an emitter or a receiver, depending on the function of the apparatus. For example, the memory device DM can receive data (write for example) or transmit data (read for example). A master is the device that initiates a data transfer on the bus and generates the clock signals to allow this transfer. At this time, any addressed device is considered a slave.

The line SDA is a bidirectional line, the data to be communicated via the I²C bus are materialized by signals which can have a HIGH level or a LOW level.

During data transmission, the line signal SDA must be stable during the HIGH period of the clock signal. The HIGH or LOW state of the data line SDA can only change when the clock signal on the line SCL is LOW.

All transactions begin with a "START" condition STT and end with a "STOP" condition STP. A HIGH to LOW transition on the line SDA while SCL is HIGH defines a start condition STT. A LOW to HIGH transition on the line SDA while SCL is HIGH defines a stop condition STP.

On the line SDA, the HIGH and LOW levels of the signal represent the logic values "1" and "0" respectively.

Data transfers follow the format shown in FIG. 1. After the start condition STT, a slave address SLADR is sent. This address is coded on 7 bits followed by an eighth bit of direction R/W, a "zero" indicating a transmission (or write) W, a "one" indicating a request for data (or read) R.

The data DATA1, DATA2 are transmitted by byte (that is to say 8 bits) on the line SDA. There is no limit to the number of bytes that can be transmitted per transfer. Each byte must be followed by a confirmation bit ACK. Conventionally, the data DATA1, DATA2 are transferred with the most significant bit MSB in the first position.

The confirmation takes place after each byte. The confirmation bit ACK allows the receiver to signal to the emitter that the byte has been successfully received and that another byte can be sent.

A data transfer always ends with a stop condition STP generated by the master.

In read or write, the first memory address to be accessed in the memory plane is communicated to the memory device immediately after the slave address SLADR.

The selection of the memory device on the bus, among several devices connected on this same bus, is well known to the person skilled in the art and depends in particular on the type and the memory size of the memory device.

For example, in some cases, the last three least significant bits of the slave address SLADR allow to select an EEPROM memory device from several memory devices, by comparing the values XXX of the bits and the assignment code associated with each EEPROM memory device.

Figure 5:
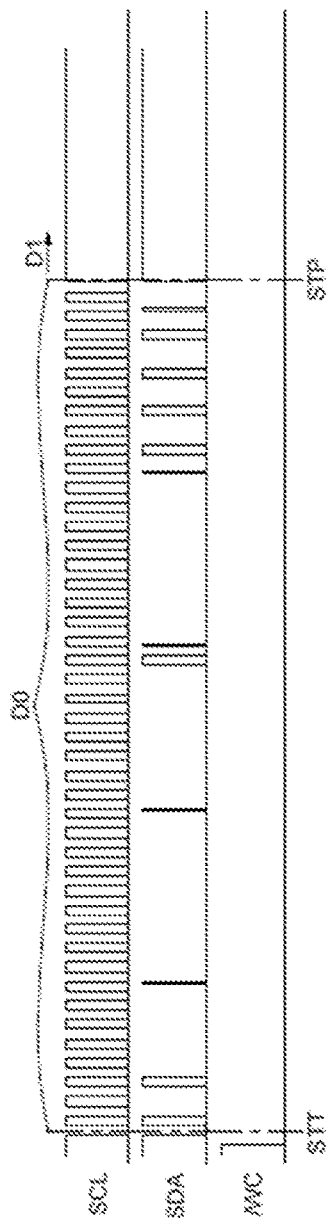
FIG. 5 illustrates a prior art example of writing in the memory device.
Figure 6:
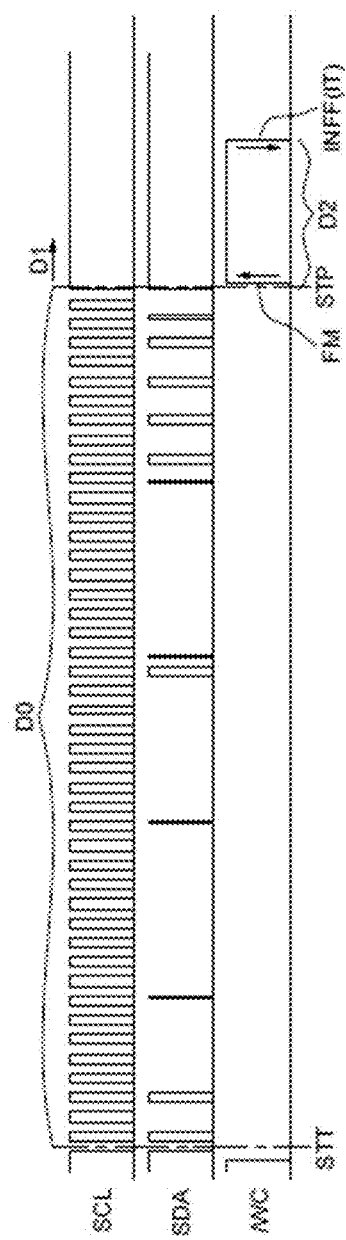
FIG. 6 illustrates an embodiment example of writing in the memory device.

Reference is now made more particularly to FIGS. 5 and 6 which respectively illustrate an example of writing in the memory device, according to the prior art (FIG. 5) and according to an embodiment and implementation of the invention (FIG. 6).

As illustrated in FIG. 5, for the duration Do which extends between the starting condition STT and the stop condition STP, the processing unit UT transmits on the line SDA a datum to be written at an address defined in the memory plane.

Moreover, for this duration D0, the signal /WC generated by the processing unit and transmitted to the auxiliary pin BRX, is in the low state, which therefore makes the write operation possible.

Upon reception of the stop condition STP, a phase D1 begins during which the memory device performs the write operation.

And, during this phase D1, the auxiliary pin BRX is not used and its logic state is not interpreted by the memory device which is, during this phase D1, no longer selected on the bus.

Unlike this prior art, while for the duration Do corresponding to step ST20 of FIG. 2, the auxiliary signal /WC remains in the low state and is managed by the processing unit UT, the logic state of this signal /WC is now managed by the memory device from the occurrence of the stop condition STP.

More specifically, upon occurrence of this stop condition STP, the memory device generates a rising edge FM on the auxiliary signal /WC so as to switch the logic state of this signal to the high state.

Then, the write operation is performed for the duration D2.

And, at the end of this duration D2, that is to say when the write operation is completed, the memory device switches the logic state of the auxiliary signal /WC again to the low state.

There is therefore a generation of a falling edge, which is interpreted by the processing unit as an interruption IT meaning the end of the write operation and corresponding to the stop information INFF.

It should be noted here that the rising edge FM of the signal /WC was not interpreted by the processing unit as an interruption because it was configured to detect as an interruption, the falling edges of the signal /WC.

Figure 7:
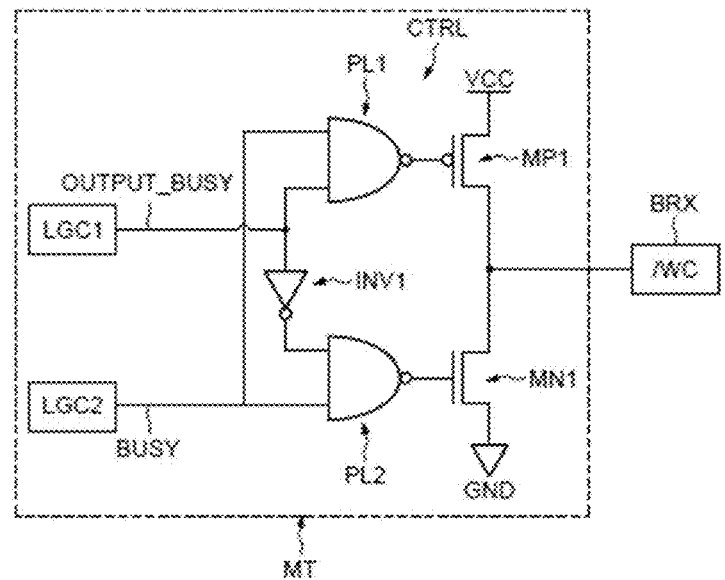
FIG. 7 illustrates a circuit allowing the management of the logic state of the signal delivered to the auxiliary terminal by the processing circuit of the memory device.

From a hardware point of view, the example of a schematic circuit, illustrated in FIG. 7, allows the management of the logic state of the signal delivered to the auxiliary terminal BRX by the processing circuit of the memory device for the duration D2.

In this regard, the processing circuit MT includes a control module CTRL including a PMOS transistor MP1 whose source is connected to the voltage VCC and whose drain is connected to the auxiliary terminal BRX, as well as an NMOS transistor MM whose source is connected to ground GND and whose drain is also connected to the auxiliary pin BRX.

The gate of the transistor MP1 is connected to the output of a NOR logic gate, referenced PL1, and the gate of the transistor MM is connected to the output of a NOR logic gate referenced PL2.

A first input of the logic gate PL1 and a first input of the logic gate PL2 receive a bit referenced BUSY.

The second input of the logic gate PIA receives a bit referenced OUTPUT_BUSY and the second input of the logic gate PL2 receives the inverted bit OUTPUT_BUSY via an inverter INV1.

The bit OUTPUT_BUSY is delivered by a control logic LGC1 while the bit BUSY is delivered by a control logic LGC2.

The bit OUTPUT_BUSY is representative of the "input mode" or "output mode" state of the auxiliary pin BRX, that is to say of the equipment which manages its logic state (the processing unit in input mode or the memory device in output mode).

Thus, for example, the bit OUTPUT_BUSY has the logic value 0 during step ST20 (duration D0) and it takes the logic state 1 when the stop condition STP occurs.

The value of this bit is managed according to the control sent to the memory ("write" signal) and the end of communication condition (corresponding to the deselection of the memory device on the bus) by the processing unit. The person skilled in the art will know how to perform the control logic LGC1 accordingly.

As for the bit BUSY, it is a bit usually delivered by the memory to mean whether or not it is available. In other words, as long as the write operation has not started, the bit BUSY is at 0. Then it switches to 1 during the write operation and switches back to 0 at the end of the write operation.

The logic LGC2 is a conventional structure logic.

It can therefore be seen in FIG. 7 that when the bit OUTPUT_BUSY is at 0, a high state is applied to the gate of the transistor MP1 turning it off. Likewise, a state 0 is applied to the gate of the transistor MN1 turning it off. Therefore, transistors MP1 and MN1 are disconnected from the auxiliary pin BRX which allows the processing unit to manage the logic state of this auxiliary pin.

On the other hand, when the stop condition STP occurs, the bit OUTPUT_BUSY switches to 1 as does the bit BUSY, the transistor MP1 turns on while the transistor MN1 is turned off. Consequently, the auxiliary signal /WC switches to the high state.

It remains in the high state until the write operation is complete. And, once the write operation is complete, the bit BUSY switches to 0 which turns off the transistor MP1 and turns on the transistor MM. Consequently, the auxiliary signal /WC switches to state 0 which causes the falling transition detected by the processing unit as an interruption and interpreted as the end-of-write information INFF.

Figure 8:
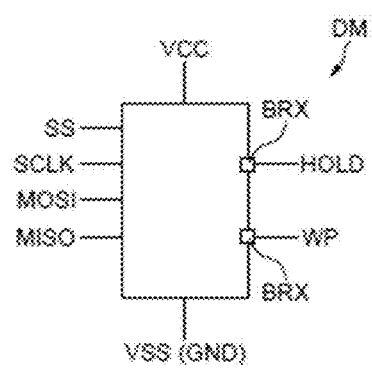
FIG. 8 illustrates a memory device connected to the processing unit by a bus supporting the SPI protocol.

In the embodiment of FIG. 8, the memory device is connected to the processing unit by a bus supporting the SPI protocol.

The SPI protocol is well known to the person skilled in the art.

Some features are recalled below.

The master is connected to one or more slaves via 4 (in a simultaneous bidirectional transmission mode) or more lines:

SCLK: clock

MOSI: master output, slave input, to transmit data to a slave

MISO: master input, slave output, to receive data from a slave

SS: slave selection line (activates low level to select the slave).

Consequently, the memory device includes four protocol pins respectively connected on the SS, MISO, MOSI and SCLK lines. These protocol pins are part of the control interface.

The memory device DM also includes two auxiliary pins BRX respectively intended to receive from the processing unit UT an auxiliary signal WP and an auxiliary signal HOLD.

The auxiliary signal WP is a signal activating or deactivating a protection of the memory device from the write operation.

When the signal WP is high, a write is possible.

When the signal WP is low, a write is not possible.

The signal HOLD is an auxiliary logic signal causing or not a pause in the communication between the processing unit and the memory device.

When the signal HOLD is in the low state, the communication is suspended while it is not suspended if the signal HOLD is in the high state.

As will be seen in more detail below, one of these two auxiliary pins can be selected as an auxiliary interface.

The SPI system can be configured to operate with a single master and a single slave, and it can be configured with multiple slaves controlled by a single master. There are two ways to connect several slaves to the master. If the master has several slave selection pins, the slaves can be wired in parallel. If only one slave selection pin is available, the slaves can be connected in cascade.

The clock signal SCLK synchronizes the output of data bits from the master to the bit sampling by the slave. One data bit is transferred to each clock cycle, so that the data transfer rate is determined by the frequency of the clock signal. The SPI communication is always initiated by the master since the master configures and generates the clock signal.

The master can select with which slave it wants to interact by bringing the SS line of the slave at a low voltage level. In the inactive state, without transmission, the slave selection line is held at a high voltage level.

The master sends data to the slave bit by bit, in series via the MOSI line. The slave receives the data sent by the master on the MOSI pin. Data sent from the master to the slave is generally, but not necessarily, sent with the most significant bit (MSB) first.

The slave can also send data back to the master via the MISO line in series. Data sent from the slave to the master is generally sent with the least significant bit (LSB) first.

The data is only valid during the low level of SS.

The steps of SPI data transmission are as follows:

The master delivers the clock signal; the master switches the SS pin to a low voltage state, which activates the slave; the master sends the data bit by bit to the slave on the MOSI line. The slave reads the bits as it receives them; if a response is required, the slave sends data bit by bit back to the master on the MISO line. The master reads the bits as it receives them.

During a write operation, the processing unit is the master on the bus and the memory device is the slave.

Figure 9:
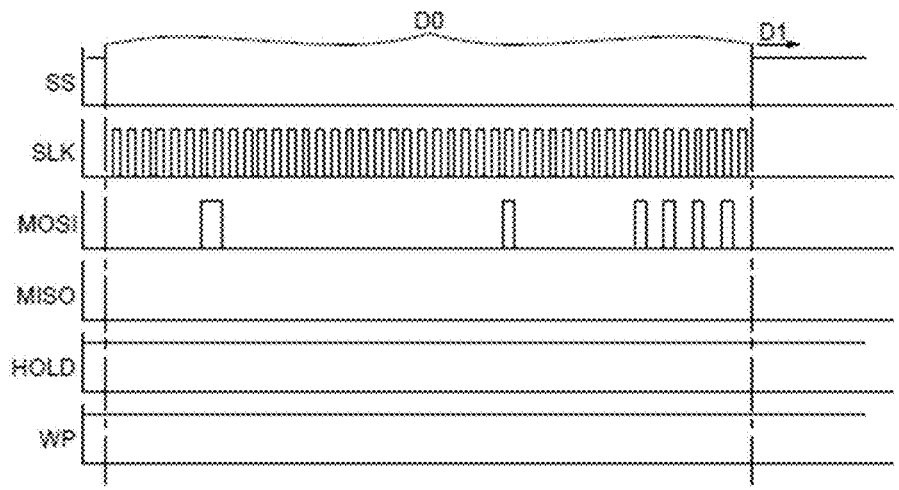
FIG. 9 illustrates a prior art write operation in a memory device.

FIG. 9 illustrates a write operation in the memory device DM according to the prior art.

During the phase Do of selecting the memory device on the SPI bus, the SS selection signal is in the low state and the write control containing the data to be written as well as the address where this data must be written, is communicated on the MOSI line.

When the product is deselected (SS signal in the high state) the phase D1, during which the actual writing is performed, begins.

It can be seen that during phase D0, the auxiliary signals HOLD and WP are here in the high state which means that the communication is not interrupted and that it is possible to write in the memory.

And, for the duration D1, these signals remain in the high state and in any case cannot be interpreted by the memory device.

Figure 10:
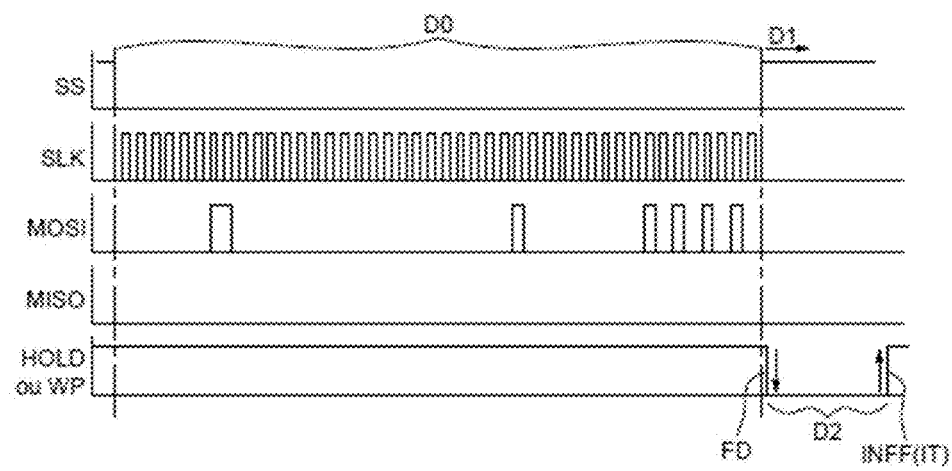
FIG. 10 illustrates an embodiment write operation in a memory device.

On the other hand, in an implementation of the invention illustrated in FIG. 10, when the memory device is deselected at the end of phase Do (SS signal in the high state) the auxiliary signal HOLD or else the auxiliary signal WP (according to the choice which has been made) goes back to the low state under the action of the processing circuit of the memory device thereby generating a falling edge FD.

This auxiliary signal remains low for the duration D2 of the actual write operation.

And, when this write operation is completed, the processing circuit MT of the memory device returns the auxiliary signal to the high state, generating an interruption IT interpreted by the processing unit as the stop information INFF of the write operation.

It should be noted here that, in the case of the SPI bus, the processing unit is configured to be in interruption detection mode on a rising edge.

Figure 11:
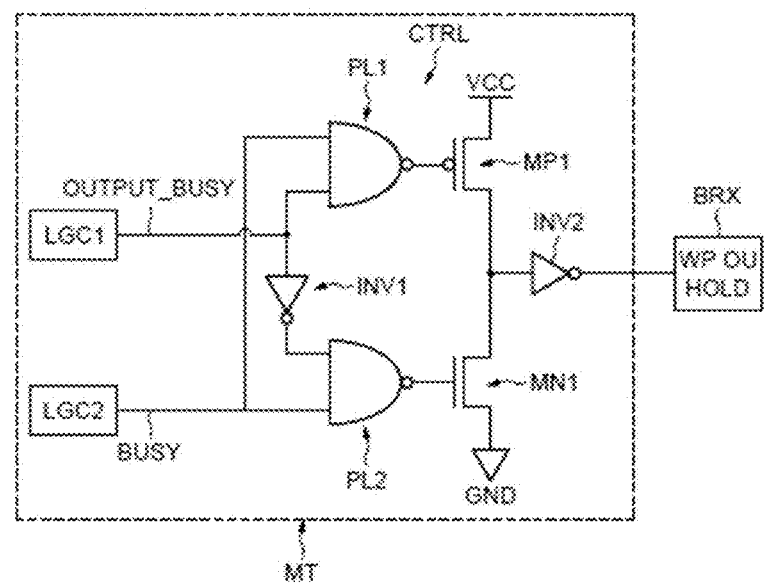
FIG. 11 illustrates a circuit allowing the management of the auxiliary signal by the processing circuit of the memory device.

An example of a hardware circuit allowing the management of the auxiliary signal HOLD or WP by the processing circuit for the duration D2 is shown in FIG. 11.

It can be seen here that the structure of this processing circuit is similar to that which has been described with reference to FIG. 7 with the difference that provision is now made of an inverter INV2, connected between the drains of transistors MP1 and MN1 and the selected auxiliary pin BRX.

The operation of this circuit is therefore similar to what has been described below, the inversion of the logic signal delivered to the terminal BRX being produced by the inverter INV2.

Moreover, the internal structure of the logic LGC1 is adapted to the signals of the SPI bus.

What is claimed is:

1. A method for managing an operation for modifying a content of a memory plane of a memory device coupled to a processing unit, the memory device comprising an auxiliary pin, the method comprising:
   communicating, by the processing unit to the memory device, a control of the operation;
   interpreting, by the memory device, a logic state of the auxiliary pin only during the communication of the control;
   executing, by the memory device, the operation;
   managing the logic state of the auxiliary pin during the execution;
   configuring the processing unit in interruption detection mode on the auxiliary pin; and
   communicating, by the memory device to the processing unit, information indicating end of the operation, the communicating comprising modifying, by the memory device, the logic state of the auxiliary pin for interpretation by the processing unit as an interruption.

2. The method according to claim 1, wherein the memory device is coupled to the processing unit by a communication medium supporting a serial communication protocol and including a clock signal line, at least one data signal line, and an auxiliary line connecting the processing unit to the auxiliary pin, the auxiliary line being separate from the clock signal line and from the at least one data signal line.

3. The method according to claim 2, wherein the communication medium supports an inter-integrated circuit (I²C) communication protocol, and the method comprises receiving, by the auxiliary pin during the communication of the control by the processing unit, an auxiliary logic signal prohibiting or authorizing the execution of the operation.

4. The method according to claim 2, wherein the communication medium supports a serial peripheral interface (SPI) communication protocol, and the method comprises receiving, by the auxiliary pin during the communication of the control by the processing unit, an auxiliary logic signal causing or not causing a pause in the communication between the processing unit and the memory device.

5. The method according to claim 2, wherein the communication medium supports a serial peripheral interface (SPI) communication protocol, and the method comprises receiving, by the auxiliary pin during the communication of the control by the processing unit, an auxiliary logic signal activating or deactivating a protection of the memory device from the operation.

6. The method according to claim 1, wherein the memory device is a non-volatile memory device.

7. The method according to claim 1, wherein the auxiliary pin is used to indicate a protection status of the memory device from a write operation or suspension of communication between the memory device and the processing unit.

8. A memory device, comprising:
   a memory plane;
   a control interface configured to be coupled to a processing unit and to receive from the processing unit a control of an operation for modifying a content of the memory plane;
   an auxiliary interface configured to be coupled to the processing unit, the auxiliary interface comprising an auxiliary pin having a logic state managed by the processing unit, the logic state interpreted by the processing unit only during the communication of the control by the processing unit; and
   a processing circuit configured to execute the operation and to communicate information indicating an end of the operation to the processing unit via the auxiliary interface, at the end of the operation, wherein the processing circuit is further configured, during the execution of the operation and during communication of stop information, to manage the logic state of the auxiliary pin and modify the logic state of the auxiliary pin to generate an interruption interpreted by the processing unit as information indicating the end of the operation.

9. The memory device according to claim 8, wherein the control interface and the auxiliary interface are configured to be coupled to the processing unit by a communication medium configured to support a serial communication protocol and including a clock signal line, at least one data signal line, and one auxiliary line connecting the processing unit to the auxiliary pin, the auxiliary line being separate from the clock signal line and from the at least one data signal line.

10. The memory device according to claim 9, wherein the communication medium is configured to support an inter-integrated circuit (I²C) communication protocol, and the auxiliary pin is configured to receive, during the communication of the control by the processing unit, an auxiliary logic signal prohibiting or authorizing the execution of the operation.

11. The memory device according to claim 9, wherein the communication medium is configured to support a serial peripheral interface (SPI) communication protocol, and the auxiliary pin is configured to receive, during the communication of the control by the processing unit, an auxiliary logic signal causing or not a pause in the communication between the processing unit and the memory device.

12. The memory device according to claim 9, wherein the communication medium is configured to support a serial peripheral interface (SPI) communication protocol, and the auxiliary pin is configured to receive, during the communication of the control by the processing unit, an auxiliary logic signal activating or deactivating a protection of the memory device from the operation.

13. The memory device according to claim 8, wherein the memory device is a non-volatile memory device.

14. The memory device according to claim 8, wherein the auxiliary pin is used to indicate a protection status of the memory device from a write operation or suspension of communication between the memory device and the processing unit.

15. A system comprising:
   a processing unit;
   a memory device comprising:
      a memory plane;

a control interface configured to receive from the processing unit a control of an operation for modifying a content of the memory plane;

an auxiliary interface comprising an auxiliary pin having a logic state managed by the processing unit, the logic state being interpreted only during the communication of the control by the processing unit; and a processing circuit configured to execute the operation and to communicate information indicating an end of the operation to the processing unit via the auxiliary interface, at the end of the operation, wherein during the execution of the operation and during communication of stop information, the processing circuit, is configured to manage the logic state of the auxiliary pin and modify the logic state of the auxiliary pin to generate an interruption interpreted by the processing unit as information indicating the end of the operation; and a communication medium coupling the control interface and the auxiliary interface of the memory device to the processing unit.

16. The system according to claim 15, wherein the control interface and the auxiliary interface are configured to be coupled to the processing unit by a communication medium configured to support a serial communication protocol and including a clock signal line, at least one data signal line, and one auxiliary line connecting the processing unit to the auxiliary pin, the auxiliary line being separate from the clock signal line and from the at least one data signal line.

17. The system according to claim 16, wherein the communication medium is configured to support an inter-integrated circuit ($I^2C$) communication protocol, and the auxiliary pin is configured to receive, during the communication of the control by the processing unit, an auxiliary logic signal prohibiting or authorizing the execution of the operation.

18. The system according to claim 16, wherein the communication medium is configured to support a serial peripheral interface (SPI) communication protocol, and the auxiliary pin is configured to receive, during the communication of the control by the processing unit, an auxiliary logic signal causing or not a pause in the communication between the processing unit and the memory device.

19. The system according to claim 16, wherein the communication medium is configured to support a serial peripheral interface (SPI) communication protocol, and the auxiliary pin is configured to receive, during the communication of the control by the processing unit, an auxiliary logic signal activating or deactivating a protection of the memory device from the operation.

20. The system according to claim 15, wherein the auxiliary pin is used to indicate a protection status of the memory device from a write operation or suspension of communication between the memory device and the processing unit.

* * * * *